United States Patent
Chen et al.

[11] Patent Number: 5,868,853
[45] Date of Patent: Feb. 9, 1999

[54] INTEGRATED FILM ETCHING/CHAMBER CLEANING PROCESS

[75] Inventors: J. G. Chen, Hsin-Chu; L. M. Huang, Taipei; W. C. Chien, Kaohsiung County; C. P. Fan, Hsin Chu Hsien, all of Taiwan

[73] Assignee: Taiwan Semiconductor Manufacturing Co. Ltd., Hsin-Chu, Taiwan

[21] Appl. No.: 878,355

[22] Filed: Jun. 18, 1997

[51] Int. Cl.$^6$ .............................. B08B 6/00; H01L 21/302
[52] U.S. Cl. .............................. 134/1.1; 134/1.2; 438/724
[58] Field of Search ...................... 134/1.1, 1.2; 438/723, 438/724

[56] References Cited

U.S. PATENT DOCUMENTS

| | | | |
|---|---|---|---|
| 4,786,360 | 11/1988 | Cote et al. | 156/643 |
| 5,271,799 | 12/1993 | Langley | 156/643 |
| 5,356,478 | 10/1994 | Chen et al. | 134/1 |

FOREIGN PATENT DOCUMENTS

| | | |
|---|---|---|
| 56-015044 | 2/1981 | Japan . |
| 62-229892 | 10/1987 | Japan . |
| 03-062520 | 3/1991 | Japan . |
| 04-242927 | 8/1992 | Japan . |
| 06-136568 | 5/1994 | Japan . |
| 07-201814 | 8/1995 | Japan . |

OTHER PUBLICATIONS

"Damage to Si Substrates During $SiO_2$ Etching: Opportunities of Subsequent Removal by Optimized Cleaning Procedures"; Vacuum, vol. 47, No. 5, pp. 437–443, May 1996, Richter et al.

*Primary Examiner*—Benjamin Utech
*Assistant Examiner*—George Goudreau
*Attorney, Agent, or Firm*—Tung & Associates

[57] ABSTRACT

The present invention discloses a method for in-situ cleaning a reactive ion etching (RIE) chamber after a silicon nitride etching process by maintaining a vacuum and a radial frequency power in the chamber while flowing a chlorine gas into the chamber at a sufficient flow rate. The chlorine gas cleaning step can be integrated into the process recipe for the etching process without significantly affecting the cycle time and the yield of the process.

16 Claims, 1 Drawing Sheet

INTEGRATED FILM ETCHING/CHAMBER CLEANING PROCESS

FIELD OF THE INVENTION

The present invention generally relates to a method for in-situ cleaning a reactive ion etching (RIE) chamber and more particularly, relates to a method for in-situ cleaning a RIE chamber after a dry etching process is conducted on a silicon nitride film by flowing a chlorine cleaning gas into the chamber while maintaining the vacuum and the RF power.

BACKGROUND OF THE INVENTION

In the fabrication of semiconductor integrated circuit (IC) devices, various structures such as insulation layers, metallization layers, passivation layers, etc., are formed or deposited on a semi-conducting substrate. It is a known fact that the quality of the IC devices fabricated is a function of the processes in which these structures are formed or deposited. The yield of an IC fabrication process, which in turn is a function of the quality of the device fabricated and a function of the cleanliness of the manufacturing environment in which the IC devices are processed.

The ever increasing trend of miniaturization of semiconductor IC devices occurred in recent years requires more stringent control of the cleanliness in the fabrication process or the processing chamber utilized in the process. This leads to a more strict control of the maximum amount of impurities and contaminants that are allowed in a process chamber. When the dimension of the miniaturized device approaches the sub-half-micron level, a minutest amount of contaminants can significantly reduce the yield of the IC manufacturing process. For instance, the yield of the process can be drastically reduced by the presence of contaminating particles during deposition or etching of films which leads to the formation of voids, dislocations or short-circuits resulting in performance and reliability problems in the IC devices fabricated.

In recent years, contamination caused by particles or films has been reduced by the improvements made in the quality of clean rooms and by the increasing utilization of automated equipment which are designed to minimize exposure to human operators. However, even though contaminants from external sources have been reduced, various contaminating particles and films are still generated inside the process chambers during the processing of semiconductor wafers. Some possible sources of contamination that have been identified include the process gases and liquids, the interior walls of the process chambers, and the mechanical wear of the wafer handling equipment. The chances of generating contaminating particles are also increased in processing chamber that are equipped with plasma enhancement. Various chemically reacted fragments are generated from the processing gases which include ions, electrons and radicals. These fragments can combine and form negatively charged particles which may ultimately contaminate a substrate that is being processed in the chamber. Various other materials, such as polymeric films may also be coated on the process chamber walls during plasma processing. The films may dislodge and fall from the process chamber walls when subjected to mechanical and thermal stresses such that they fall onto the wafers that are being processed.

A good example for illustrating chamber wall contamination is the etcher 10 shown in FIG. 1. Etcher 10 is a plasma etching chamber that is equipped with magnetic field enhancement generated by an upper rotating magnet 12 and a lower rotating magnet 14. The plasma etcher 10 includes a housing 16 that is typically made of a non-magnetic material such as aluminum which defines a chamber 20. A substrate holder 22 which is also a cathode is connected to a radial-frequency generator 24 which is in turn connected to a gas inlet or showerhead 26. The showerhead 26 also acts as an anode. A process gas 28 is supplied to chamber 20 through the gas inlet showerhead (or the manifold plate) 26. A semi-conducting substrate 30 to be processed is positioned on the substrate holder or cathode 22.

The semi-conducting substrate 30 is normally held against the substrate holder 22 by a clamp ring 32. During a plasma etching process, a semi-conducting wafer 30 heats up during the process and therefore must be cooled by a cooling gas from a cooling gas supply (not shown) such that heat can be transferred to a water cooled wafer holder 36. The function of the clamp ring 32 is also to hold the wafer 30 down against the pressure generated by the cooling gas. An exhaust port 34 which is connected to a vacuum pump (not shown) evacuates the chamber. During an etching process, the upper rotating magnet 12 and the lower rotating magnet 14 function together to provide a magnetic field inside the process chamber 20.

In a conventional cleaning process for a plasma etch chamber 10, a cleaning gas supply is first flown through the gas inlet port 26 into the chamber 20 and then, the RF generator 24 is turned on. This cleaning procedure is conducted after a predetermined number, e.g., between 100~500 wafers, have been processed in chamber 20. A plasma of the cleaning gas ions is formed in the space between the showerhead 26 and the wafer holder 32 to loosen the contaminating particles and films from the chamber walls and the upper electrode or showerhead 26.

In a silicon nitride etching process, it was discovered that when a wafer is coated with a photoresist layer, patterned and then placed in an etch chamber for a plasma etching process, the etchant gas flown into the chamber also etches the photoresist layer which is normally of a polymeric base. A byproduct of the photoresist layer when etched by the etchant gas is a fluorine-containing or Teflon-type polymer which deposits on the chamber walls and the upper electrode. When the polymeric contaminating film deposited on the chamber walls become too thick, the gravity and the mechanical stress generated by the pressure differential each time the chamber door is opened for loading or unloading loosen the polymeric films from the chamber walls. These contaminating films or particles dislodge from the chamber walls during a nitride film etching process onto the wafer surface. The contamination decreases the yield significantly since nitride etching is frequently used to define the activation regions in an IC chip.

FIGS. 2A~2D provides an illustration of the effect of such contamination. In FIG. 2A, a pre-processed semi-conducting substrate 40 which is coated with a silicon nitride layer 42 is provided. On top of the nitride layer 42, a photoresist layer 44 is deposited and patterned. During a subsequent etching process for the silicon nitride layer 42, a polymeric film 46 dislodged from the chamber walls falls on the surface of the wafer 40. The polymeric film 46 acts as a mask during the nitride etching process and as a consequence, the area covered by the polymeric film is not etched away during the nitride etching. This is shown in FIG. 2B.

In a subsequent processing step where a field oxide isolation (FOX) is grown, FOX does not grow in the area that is still covered by the silicon nitride. Therefore, only a very small field oxide 50 is grown. This is shown in FIG. 2C.

For comparison, FIG. 2D illustrates a normally grown field oxide 52 without the polymeric film contamination problem. The problem in growing field oxide regions (or the lack of growth of a FOX region) is frequently known as a "FOX missing" defect.

The conventional chamber cleaning method which is carried out only after a large number of wafers have been processed in the chamber has been proven to be ineffective since many defective wafers can be produced in-between the two chamber cleaning procedures. Only a limited number of defect-free wafers can be produced after each chamber cleaning procedure is carried out.

It is therefore an object of the present invention to provide a method for in-situ cleaning of an etch chamber that does not have the drawbacks and shortcomings of the conventional cleaning methods.

It is another object of the present invention to provide a method for in-situ cleaning an etch chamber that can be integrated into the process recipe as part of the etching process.

It is a further object of the present invention to provide a method for in-situ cleaning an etch chamber capable of ensuring that each etching process is carried out in a clean chamber.

It is still another object of the present invention to provide a method for in-situ cleaning a RIE chamber after an etching process is conducted on a silicon nitride film deposited on a semi-conducting substrate.

It is another further object of the present invention to provide a method for in-situ cleaning of a RIE chamber by integrating a chlorine gas cleaning step into the process recipe.

It is yet another object of the present invention to provide a method for in-situ cleaning a RIE chamber which is used for silicon nitride etching process by a main etching step and an over etching step by incorporated a chlorine cleaning procedure as the third step of the etching process.

It is still another further object of the present invention to provide a method for in-situ cleaning a RIE chamber after a nitride film etching process is conducted in the chamber by integrating a chlorine cleaning step with the main etching step for the nitride film.

SUMMARY OF THE INVENTION

In accordance with the present invention, a method for in-situ cleaning an etch chamber after a nitride etching process is conducted by integrating a chlorine cleaning step as part of the process recipe is provided.

In a preferred embodiment, a method for in-situ cleaning a RIE chamber after an etching process can be carried out by first conducting a RIE process on a film deposited on a semiconductor substrate, and then flowing a chlorine gas into the chamber at a flow rate not less than 50 sccm while maintaining a vacuum and a RF power in the chamber.

In another preferred embodiment, a method for in-situ cleaning a RIE chamber after a silicon nitride etching process can be carried out by maintaining a vacuum and a radial frequency power in the chamber, and then flowing a chlorine gas into the chamber at a flow rate of between about 50 sccm and about 500 sccm.

In yet another preferred embodiment, a RIE process for silicon nitride can be carried out by the operating steps of first positioning a semiconductor device having a silicon nitride film deposited on top in a RIE chamber, then flowing a first etchant gas into the chamber which comprises at least one gas selected from the group consisting of $CF_4$, $SF_4$, $C_2F_6$, $SF_6$, $C_3F_8$ and $O_2$, and then flowing a cleaning gas of chlorine into the chamber at a flow rate of at least 50 sccm.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention provides a method for in-situ cleaning a reactive ion etching (RIE) chamber after a silicon nitride etching process by first maintaining a vacuum and a RF power in the chamber and then flowing a chlorine gas into the chamber at a sufficient flow rate to clean all contaminating films and particles from the chamber walls and the upper electrode. The chlorine gas cleaning step can be integrated into the process recipe and be carried out immediately after a main etching step or main etching/over etching steps is carried out for the silicon nitride film.

Figure 1:
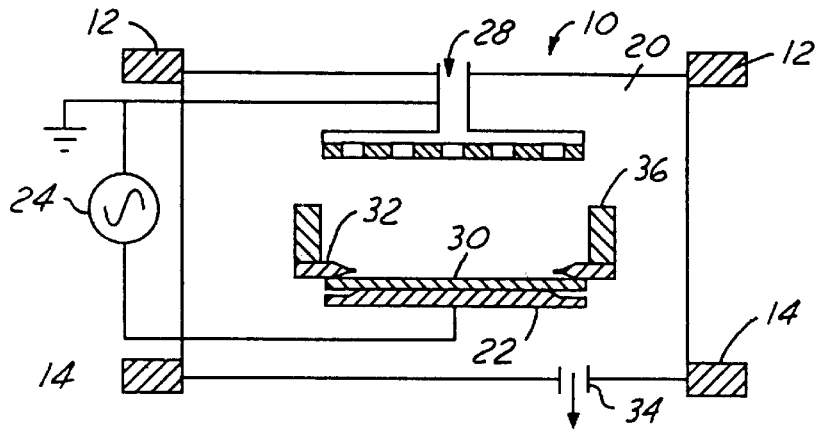
FIG. 1 is a schematic illustrating a cross-sectional view of a plasma reactive ion etching apparatus.
Figure 2A:
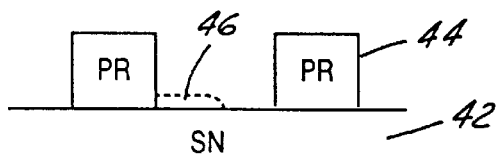
FIGS. 2A~2D are enlarged, cross-sectional views illustrating a silicon nitride film etching process that is contaminated by a polymeric film.
Figure 2B:
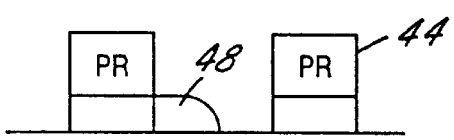
Figure 2C:
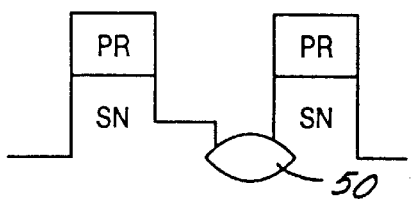
Figure 2D:
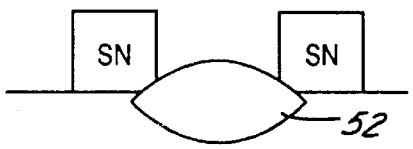
Figure 3:
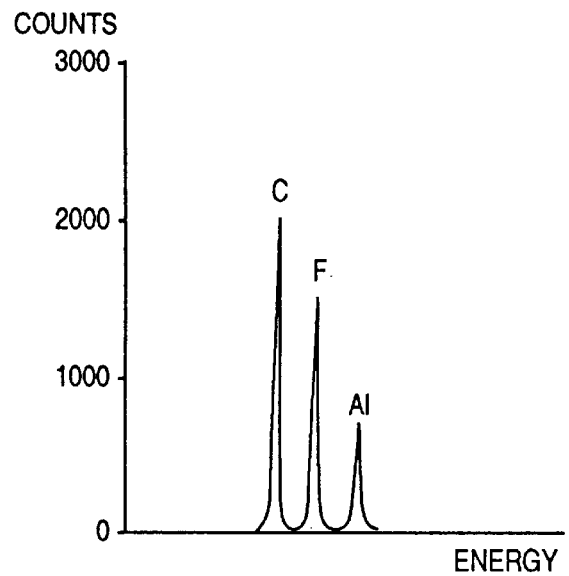
FIG. 3 is a graph illustrating an EDX analysis of a contaminating particle showing its chemical composition.

Referring initially to FIG. 3, wherein a graph showing the results of an EDX analysis conducted on a contaminating particle obtained from a RIE chamber. The three main elements identified by the peaks are carbon, fluorine and aluminum. Since aluminum was used as the upper electrode in the RIE chamber, it is etched by the plasma etching gas and formed an aluminum byproduct in a contaminating particle. It has been found that chlorine gas plasma is an effective cleaning gas for aluminum-containing contaminating byproducts.

The present invention novel chamber cleaning method can be advantageously carried out as part of a process recipe for etching silicon nitride films. As shown in Table I, the etching process of a silicon nitride film can be carried out in a main etching step or a combination of a main etching step and an over etching step.

TABLE 1

|  | M/F | O/E | Cleaning |
| --- | --- | --- | --- |
| Pressure (m torr) | 400 | 400 | 200 |
| RF (W) | 215 | 160 | 200 |
| Gap (cm) | 1.2 | 1.8 | 0.5 |
| $SF_6$ (sccm) | 150 | 40 | 0 |
| $O_2$ (sccm) | 0 | 5 | 0 |
| $H_e$ (sccm) | 150 | 0 | 70 |
| $Cl_{12}$ (sccm) | 0 | 0 | 130 |

The novel chlorine gas cleaning method can be added to the process recipe and carried out either after the main etching step or after the over etching step. In the main etching step, the profile of an etched structure is defined by stopping the etching process by an end-point mode. The combination main etching/over etching step is more preferred since the etching process for silicon nitride can be carried out in a shorter etch time. When a silicon nitride film of approximately 1500 Å is etched, a thin pad oxide under layer of approximately 250 Å thick must not be damaged. It is therefore desirable to use an etch chemistry that has a high etch rate for the silicon nitride film but a low etch rate for the pad oxide film. In other words, the etch rate ratio for nitride/oxide should be sufficiently high, or the etch chemistry should have a high selectivity to oxide. When the demand on etch selectivity is high and the etch uniformity and profile obtained is relatively poor, the present invention two-step etching process can be advantageously used to improve the overall etch process.

In the main etching step, as shown in Table I, an etch gas of $SF_6$ is utilized at a preferred flow rate of 150 sccm. The chamber pressure is kept at 400 m torr and the radial frequency power is kept at 215 watts. The gap between the electrodes is approximately 1.2 cm. An inert carrier gas of helium can be suitably used at a flow rate of 150 sccm. During the main etching step, the etch rate for silicon nitride is high and the profile obtained after etching is satisfactory. However, the selectivity of the etchant gas $SF_6$ for nitride/oxide is not adequate. An end-point mode for controlling the etch process can be used to stop the main etching step after reaching the end-point. After the end-point has been reached, the over etching step can be started wherein an etchant gas mixture of $SF_6$ and $O_2$ can be suitably used. The $SF_6$ is flown into the chamber at a flow rate of approximately 40 sccm while mixing with $O_2$ at a flow rate of approximately 5 sccm. The pressure of the etch chamber is maintained at 400 m torr and the etch power is maintained at 160 watts. The gap between the electrodes is maintained at 1.8 cm. No inert carrier gas is used. The over etching step is advantageously used to etch the portion that was not properly etched by the main etching step. The etchant gas mixture used in the over etching step has high selectivity and thus low etch rate for oxide. The etching process can therefore be easily controlled. Since a pad oxide layer of approximately 250–300 Å is provided under the silicon nitride layer, when the silicon nitride layer is etched by the main etching step to the nitride/oxide interface, the emission due to the nitride component drops significantly to signal the end-point for the main etching step.

In the over etching step, a time mode is utilized for operating the etch for an etch time of approximately 20–25 seconds. After the completion of the over etching step, a chlorine gas is flown into the etch chamber at a flow rate of approximately 130 sccm diluted by a helium gas at a flow rate of approximately 70 sccm. It has been found that a suitable flow rate for chlorine is between about 50 sccm and about 500 sccm. During the chlorine gas cleaning step, the chamber pressure is maintained at 200 m torr, the radial frequency power is maintained at 200 watts while the gap between the electrodes is maintained at 0.5 cm. The chlorine cleaning gas is flown through the etch chamber for a time period of approximately less than 10 seconds. It was found that for most processes, a cleaning time between about 2 seconds and about 20 seconds may be adequately used. Due to the short cleaning time required by the chlorine gas, the cycle time for the nitride etch process is not significantly affected. As a result, the yield is not affected.

The present invention novel process of chlorine chamber cleaning can be advantageously integrated into a process recipe for the nitride etch process. It can be suitably conducted as an added third step in a two-step, main etch/over etch process. Alternatively, the chlorine cleaning process can replace the over etching step and be combined with the main etching step in a two-step etching/cleaning process. It has been found that in the over etching step, the etchant gas of $SF_6/O_2$ has a high selectivity for nitride/oxide at approximately 4:1 (i.e., nitride is etched four times faster than oxide). Since chlorine gas has a slightly higher etch selectivity for nitride/oxide, i.e., at approximately 4.5:1, the chlorine cleaning step is very compatible with the etch process and therefore, can be integrated easily into the process receipt.

The benefits achieved by the present invention novel in-situ chlorine cleaning process can be seen in Tables II and III.

TABLE 2

| Lot ID | PCS - Sample | Wafers Processed | Number of Contaminating Particles | FOX Missing Defects |
|---|---|---|---|---|
| A | 2 | 72 | 0 | 0 |
| B | 2 | 1728 | NA | 5 |
| C | 2 | 3000 | 64 | 20 |
| D | 2 | 6000 | 25 | 9 |
| E | 2 | 9500 | 14 | 8 |
| F | 2 | 10000 | 16 | 12 |

TABLE 3

| Lot ID | PCS - Sample | Wafers Processed | Number of Contaminating Particles | FOX Missing Defects |
|---|---|---|---|---|
| L | 2 | 250 | 1 | 1 |
| M | 3 | 2500 | 2 | 0 |
| N | 2 | 4750 | 1 | 0 |
| O | 4 | 7750 | 5 | 0 |
| P | 4 | 8250 | 4 | 0 |
| Q | 2 | 9250 | 11 | 0 |
| R | 4 | 9750 | 7 | 0 |

In Table 2, data were collected on wafer lots A through F conducted in a nitride etching process without the chlorine gas plasma cleaning step. It is seen that two pieces of sample were tested for each lot of wafers. The contaminating particle counts on the control wafer is taken after 72 cycles, 2500 cycles . . . 10000 cycles. The contaminating particle counts range between 0 after 72 wafers to as high as 64 after 3000 wafers. The FOX missing defect counts is also shown in Table 2. It is noted that the defect counts range between 0 after 72 wafers and 20 after 3000 wafers.

Table 3 illustrates data obtained on wafer samples L through wafer sample R after a nitride etching and an integrated chlorine gas cleaning process. It is seen that data were taken at approximately the same number of wafers processed (or cycles) as in Table 1. Number of contaminating particles counted is drastically reduced from that shown in Table 2, i.e., ranges between 1 and 11 for samples taken after 250 wafers and after 9250 wafers. The defect counts for FOX missing is essentially zero for all samples. The effectiveness of the present invention in-situ chlorine cleaning process is self-evident after examining data contained in Table 3.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A method for in-situ cleaning an etch chamber after an etching process comprising the steps of:

conducting a silicon nitride etching process on a film deposited on a semiconductor substrate, and flowing a chlorine cleaning gas into said chamber at a flow rate not less than 50 sccm while maintaining a vacuum and a radio frequency power in said chamber.

2. A method according to claim 1, wherein said silicon nitride etching process is conducted by using at least one etchant gas selected from the group consisting of $CF_4$, $SF_4$, $C_2F_6$, $SF_6$, $C_3F_8$ and $O_2$.

3. A method according to claim 1, wherein said silicon nitride etching process is conducted by using an etchant gas mixture of $SF_6$ and $O_2$.

4. A method for in-situ cleaning a reactive ion etching (RIE) chamber after a silicon nitride etching process comprising the steps of:

maintaining a vacuum and a radio frequency power in said chamber, and flowing a chlorine gas into said chamber at a flow rate of not less than 50 sccm.

5. A method according to claim 4, wherein said silicon nitride etching process is conducted in a main etching step and an over etching step.

6. A method according to claim 4, wherein said silicon nitride etching process is conducted by using at least one etchant gas selected from the group consisting of $CF_4$, $SF_4$, $C_2F_6$, $SF_6$, $C_3F_8$ and $O_2$.

7. A method according to claim 4, wherein said silicon nitride etching process is conducted by using an etchant gas of $SF_6/O_2$ or $SF_6$.

8. A method according to claim 4, wherein said chlorine gas is flown into said chamber preferably at a flow rate between about 50 sccm and about 500 sccm.

9. A method according to claim 4, wherein said chlorine gas is flown into said chamber for a time period of at least 5 seconds.

10. A method according to claim 5, wherein said main etching step is terminated by an end-point mode and said over etching step is terminated by a time mode.

11. A reactive ion etching (RIE) method for silicon nitride comprising the steps of:

positioning a semiconductor device having a silicon nitride layer deposited on top in a RIE chamber, depositing and patterning a photoresist layer on said silicon nitride layer, flowing a first process gas into said chamber, said process gas is at least one gas selected from the group consisting of $CF_4$, $SF_4$, $C_2F_6$, $SF_6$, $C_3F_8$ and $O_2$, and flowing a cleaning gas of chlorine into said chamber at a flow rate of at least 50 sccm.

12. A method according to claim 11 further comprising the step of flowing a second process gas into said chamber in a second etching step after said etching step by said first process gas is completed.

13. A method according to claim 12, wherein said second process gas is at least one gas selected from the group consisting of $CF_4$, $SF_4$, $C_2F_6$, $SF_6$, $C_3F_8$ and $O_2$.

14. A method according to claim 12, wherein said first process gas is $SF_6$ and said second process gas is a mixture of $SF_6$ and $O_2$.

15. A method according to claim 11, wherein said chlorine gas is flown into said chamber at a flow rate of preferably between about 50 sccm and about 500 sccm.

16. A method according to claim 12, wherein said etching process by said first process gas is terminated by an end-point mode and said etching process by said second process gas is terminated by a time mode.

* * * * *